United States Patent
Sahlin et al.

(10) Patent No.: US 8,434,276 B2
(45) Date of Patent: May 7, 2013

(54) ATTACHMENT OF PHOTOVOLTAIC DEVICES TO SUBSTRATES USING SLOTTED EXTRUSION MEMBERS

(75) Inventors: Katherine M. Sahlin, Old Orchard Beach, ME (US); Marcel Dery, Westford, MA (US); Michael P. Cushman, Merrimack, NH (US)

(73) Assignee: Saint-Gobain Performance Plastics Corporation, Aurora, OH (US)

( * ) Notice: Subject to any disclaimer, the term of this patent is extended or adjusted under 35 U.S.C. 154(b) by 0 days.

(21) Appl. No.: 13/609,214

(22) Filed: Sep. 10, 2012

(65) Prior Publication Data
US 2013/0000230 A1  Jan. 3, 2013

Related U.S. Application Data

(63) Continuation of application No. 13/030,296, filed on Feb. 18, 2011, now Pat. No. 8,261,496.

(60) Provisional application No. 61/305,646, filed on Feb. 18, 2010.

(51) Int. Cl.
*E04D 13/18* (2006.01)
*H01L 31/042* (2006.01)

(52) U.S. Cl.
USPC .............. 52/173.3; 52/200; 52/22; 52/582.1; 136/244; 136/251; 126/704

(58) Field of Classification Search ............... 52/173.3, 52/220, 22, 251, 586.1, 586.2, 582.1, 656.1, 52/665; 136/244, 251; 126/623, 704; 403/292
See application file for complete search history.

(56) References Cited

U.S. PATENT DOCUMENTS

| | | | | |
|---|---|---|---|---|
| 3,030,290 A * | 4/1962 | Ryan, Jr. | | 204/169 |
| 3,255,099 A * | 6/1966 | Wolinski | | 204/169 |
| 3,274,089 A * | 9/1966 | Wolinski | | 204/165 |
| 3,274,090 A * | 9/1966 | Amborski | | 204/165 |
| 3,274,091 A * | 9/1966 | Amborski | | 204/165 |
| 3,275,540 A * | 9/1966 | McBride | | 204/165 |
| 3,284,331 A * | 11/1966 | McBride et al. | | 204/165 |
| 3,291,712 A * | 12/1966 | McBride | | 204/165 |
| 3,296,011 A * | 1/1967 | McBride et al. | | 427/522 |
| 3,391,314 A * | 7/1968 | Carter | | 361/229 |
| 3,397,132 A * | 8/1968 | Wolinski | | 204/165 |
| 3,485,734 A * | 12/1969 | Pecka | | 204/165 |
| 3,507,763 A * | 4/1970 | McBride | | 204/169 |
| 3,676,181 A * | 7/1972 | Kowalewski | | 427/533 |
| 3,928,703 A * | 12/1975 | Cook | | 442/85 |
| 4,549,921 A * | 10/1985 | Wolfe, Jr. | | 156/272.6 |
| 4,770,927 A * | 9/1988 | Effenberger et al. | | 442/126 |
| 6,726,979 B2 * | 4/2004 | Friedman et al. | | 428/141 |
| 7,939,615 B2 * | 5/2011 | Ou et al. | | 528/26 |
| 2001/0054262 A1 * | 12/2001 | Nath et al. | | 52/173.3 |
| 2008/0221232 A1 * | 9/2008 | Ou et al. | | 521/154 |

(Continued)

OTHER PUBLICATIONS

Sina Ebnesajjad, "Non-melt Processible Fluoroplastics: The Definitive User's Guide and Databook", 2000, Plastics Design Library, Norwich, NY, pp. 175-178.

*Primary Examiner* — Mark Wendell
(74) *Attorney, Agent, or Firm* — Scott D. Rothenberger; Fulbright & Jaworski L.L.P.

(57) ABSTRACT

The invention describes extruded member systems to which a photovoltaic device is secured to an architectural surface.

12 Claims, 3 Drawing Sheets

U.S. PATENT DOCUMENTS

| | | | |
|---|---|---|---|
| 2009/0133340 A1* | 5/2009 | Shiao et al. | 52/173.3 |
| 2009/0162664 A1* | 6/2009 | Ou | 428/421 |
| 2009/0255573 A1* | 10/2009 | Taylor | 136/251 |
| 2010/0206377 A1* | 8/2010 | Sahlin et al. | 136/256 |
| 2011/0056559 A1* | 3/2011 | Sahlin et al. | 136/259 |
| 2011/0247686 A1* | 10/2011 | Honeker et al. | 136/256 |
| 2011/0297228 A1* | 12/2011 | Li et al. | 136/259 |
| 2012/0003448 A1* | 1/2012 | Weigel et al. | 428/212 |

* cited by examiner

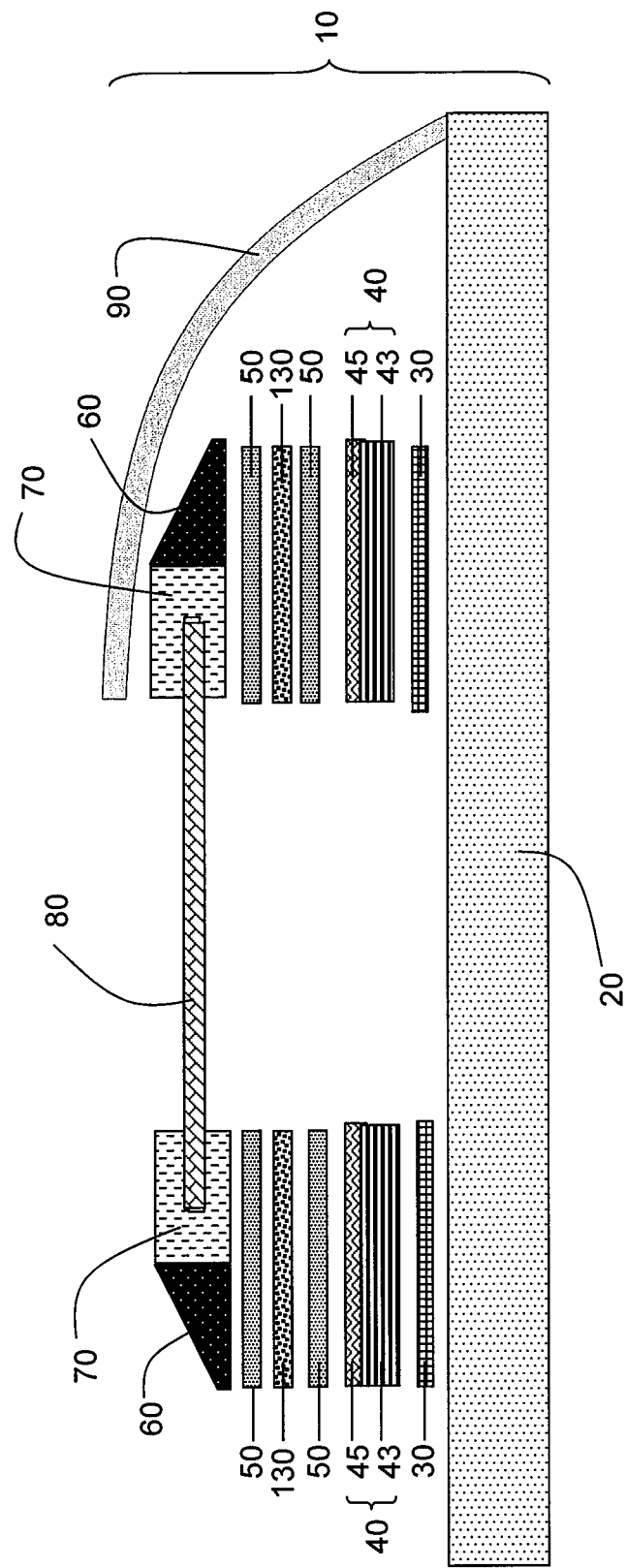

ATTACHMENT OF PHOTOVOLTAIC DEVICES TO SUBSTRATES USING SLOTTED EXTRUSION MEMBERS

CROSS REFERENCE TO RELATED APPLICATIONS

This application is a continuation of U.S. patent application Ser. No. 13/030,296, filed Feb. 18, 2011, entitled "ATTACHMENT OF PHOTOVOLTAIC DEVICES TO SUBSTRATES USING SLOTTED EXTRUSION MEMBERS", which claims priority to U.S. Provisional Patent Application No. 61/305,646, filed Feb. 18, 2010, entitled "ATTACHMENT OF PHOTOVOLTAIC DEVICES TO SUBSTRATES USING SLOTTED EXTRUSION MEMBERS", the contents of which is incorporated herein in their entirety for all purposes.

FIELD OF THE INVENTION

The invention generally relates to a system that provides a shaped edge that includes a slot suitable to engage and support a photovoltaic device. The shaped edging is adhered to the surface of an architectural membrane. The construction of the system allows for extensibility as stresses are placed upon the architectural membrane, shaped edging, photovoltaic device and/or components that adhere the extruded slotted member to the architectural membrane.

BACKGROUND OF THE INVENTION

Photovoltaic devices, also referred to as solar cells or solar modules, can be affixed to the rooftop of building structures. These devices convert light energy from the sun into electricity that may be used or stored for later use. Many buildings have roofs that may be desirable for solar cell or solar module placement.

Traditionally, installation of photovoltaic systems involves attaching the device to a roof with mechanical fasteners such as bolts or screws. While this can be effective to secure the devices, damage to the roof can occur during installation.

For example, the holes may leak, the holes may be the source of other eventual failures such as tearing or cracking and/or the installation of screws or bolts can be time consuming and require precise measurement and drilling of fastener holes. Perhaps more importantly, mechanical fasteners are relatively permanent, and the photovoltaic devices may not be easily moved or removed without leaving damaged roof sections.

Such issues with securing the photovoltaic device to a roof is exacerbated where the roof is of "tensioned" or air supported type construction. Architectural membranes are used in tension or air supported type construction, where the membrane is stretched (placed under tension) across supporting members. Securing a photovoltaic device by screws or fasteners to such an architectural membrane would either lead to complete failure of the membrane by tearing, or at the very least, provide holes that would permit leakage.

Therefore, a need exists for ways to secure photovoltaic devices to architectural membranes that do not compromise the water resistant properties thereof and that are integrated into the roofing system.

BRIEF SUMMARY OF THE INVENTION

The present invention surprisingly provides a photovoltaic device/architectural membrane system that advantageously has extensible properties, such that the system has the ability to elongate/extend/shrink/deform without damage to the photovoltaic device. In one aspect, it can be understood that the underlying architectural membrane has physical attributes to conform to given atmospheric conditions (heat, cold, rain, snow, wind, etc.) whereas the photovoltaic device generally is less flexible. However, by the unique construction of the system, the architectural membrane can conform to the changes while the photovoltaic device remains relatively non-extensible. As a metaphor, it can be thought of similarly to earthquake resistant building in California, where the building is supported on a series of rollers/springs that absorb deformations due to an earthquake, while the remainder of the building does not need to conform. Similarly, the underlying architectural membrane system can adapt to applied stresses and weather related conditions, while the photovoltaic device is not required to do so.

The system includes a photovoltaic device/architectural membrane system that includes a first fluoropolymer layer, a second bondable layer, a third fluoropolymer layer that is "sided", a fourth adhesive layer, a shaped edging that engages and supports a photovoltaic device and the photovoltaic device.

The first layer comprises a fluoropolymer encapsulated reinforcement layer having a first side and a second side. The second layer comprises a bondable layer disposed on the second side of the first layer. The third layer comprises a fluoropolymer encapsulated reinforcement such that the first side provides an unencapsulated reinforcement surface, such that the second side provides a fluoropolymer surface that can be adhered to the bondable layer located there between. The fourth layer comprises an adhesive disposed upon the unencapsulated reinforcement surface of the third layer. The shaped edging is disposed upon the fourth layer and includes an outer edge and an inner edge. A profiled portion, e.g., a slot is formed within the shaped edging and located about the inner edge. The shaped edging is suitable to engage and support a photovoltaic device.

In another embodiment, a fifth layer and sixth layer can further be included. In one aspect, the fifth layer is a hook and loop system, a flexible substrate such as a foam, or an elastomeric sealant.

If the fifth layer is present, then a sixth layer of adhesive would be disposed between the fifth layer and the shaped edging, although it is possible that fifth layer could be directly bonded to the third layer and shaped edging by heat sealing directly to each other.

As noted above, by inclusion of the layers of the system described herein, the system itself is flexible enough to withstand physical changes due to wind, rain, snow, heat, cold, etc. The construction is unique where, for example, the fluoropolymer/reinforcement layer, the bondable layer, and/or an adhesive all provide extensibility for the ultimate construct.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the detailed descriptions are to be regarded as illustrative in nature and not restrictive.

BRIEF DESCRIPTION OF THE DRAWINGS

FIG. 3 provide a second specific embodiment of the invention.

DETAILED DESCRIPTION

Figure 1:
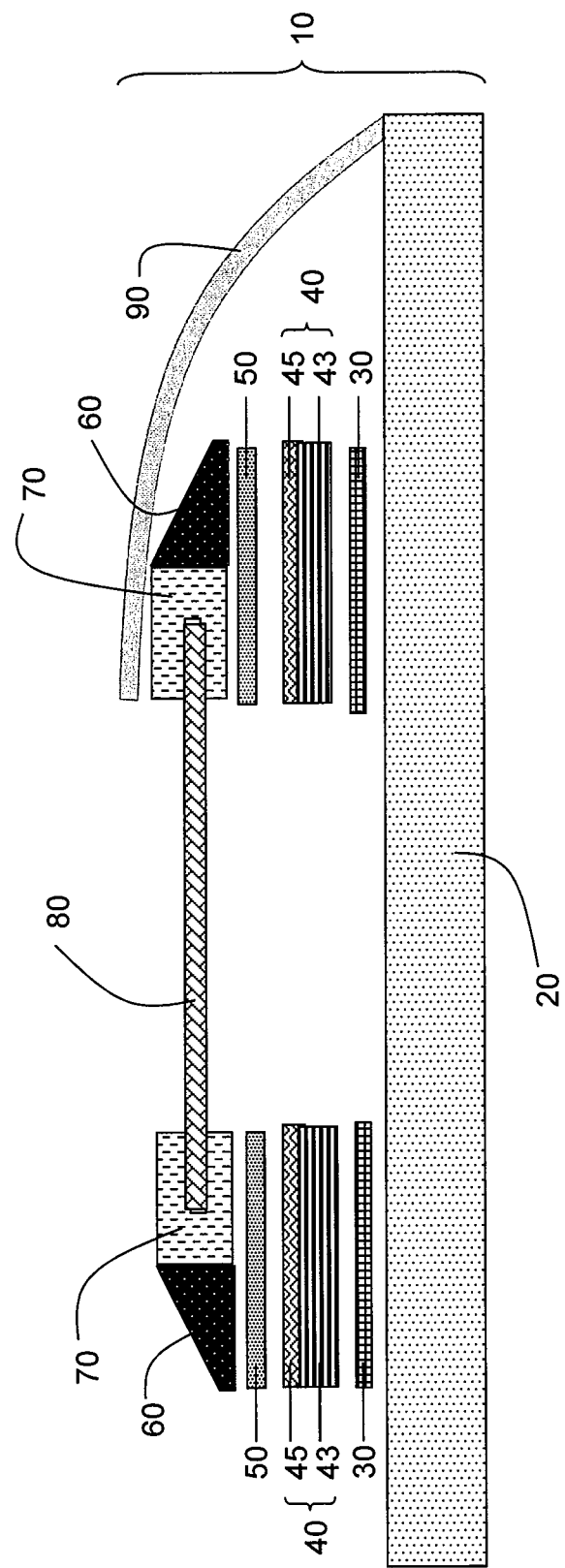
FIG. 1 provides a general embodiment of the invention.

In the specification and in the claims, the terms "including" and "comprising" are open-ended terms and should be interpreted to mean "including, but not limited to . . . ." These terms encompass the more restrictive terms "consisting essentially of" and "consisting of."

It must be noted that as used herein and in the appended claims, the singular forms "a", "an", and "the" include plural reference unless the context clearly dictates otherwise. As well, the terms "a" (or "an"), "one or more" and "at least one" can be used interchangeably herein. It is also to be noted that the terms "comprising", "including", "characterized by" and "having" can be used interchangeably.

Unless defined otherwise, all technical and scientific terms used herein have the same meanings as commonly understood by one of ordinary skill in the art to which this invention belongs. All publications and patents specifically mentioned herein are incorporated by reference in their entirety for all purposes including describing and disclosing the chemicals, instruments, statistical analyses and methodologies which are reported in the publications which might be used in connection with the invention. All references cited in this specification are to be taken as indicative of the level of skill in the art. Nothing herein is to be construed as an admission that the invention is not entitled to antedate such disclosure by virtue of prior invention.

In one aspect, the present invention provides photovoltaic device/architectural membrane systems that include a first fluoropolymer layer, a second bondable layer, a third fluoropolymer layer that is "sided", a fourth adhesive layer, a shaped edging that engages and supports a photovoltaic device and the photovoltaic device.

Generally, the first layer comprises a fluoropolymer encapsulated reinforcement layer having a first side and a second side. The second layer comprises a bondable layer disposed on the second side of the first layer. The third layer comprises a fluoropolymer encapsulated reinforcement such that the first side provides an unencapsulated reinforcement surface, such that the second side provides a fluoropolymer surface that can be adhered to the bondable layer located there between. The fourth layer comprises an adhesive disposed upon the unencapsulated reinforcement surface of the third layer. Shaped edging is disposed upon the fourth layer and includes an outer edge and an inner edge. A profiled portion, e.g., a slot, is formed within the shaped edging and located about the inner edge. The shaped edging is suitable to engage and support a photovoltaic device.

In another embodiment, a fifth layer and sixth layer can further be included. In one aspect, the fifth layer is a hook and loop system, a flexible substrate such as a foam, or an elastomeric sealant.

If the fifth layer is present, then a sixth layer of adhesive would be disposed between the fifth layer and the shaped edging, although it is possible that fifth layer could be directly bonded to the third layer and shaped edging by heat sealing directly to each other.

One advantage of the system is the ability to remove and replace photovoltaic components from the system without the damage to the underlying support. Therefore, when a photovoltaic component is damaged, is worn out, requires maintenance, etc., the component can simply be removed and either replaced or repaired and reattached without the need to reattached by fasteners or screws as more traditional systems. It should be understood that another advantage is that the photovoltaic component is securely fastened to the system, such that it can withstand wind, rain, snow, heat, cold, etc. while still accommodating the flexing and elongation of the membrane. The systems described herein provide the ability to change/replace the device while still providing a strong enough engagement that the elements do not cause the component to be easily separated from the system.

The phrase "photovoltaic device" include photovoltaic cells, solar cells or modules comprising crystalline silicon, a-silicon (amorphous silicon); CIGS (Copper Indium Gallium diSelenide); DSSC (Dye Sensitized Solar Cell); OPV (Organic Photovoltaic); CdTe (Cadmium Telluride) GdAs (Gallium Arsenide) or, for example, a Unisolar PVL-136 laminate and the like. The photovoltaic construction can be rigid such as crystalline silicon with a glass front surface or flexible, such as thin film amorphous silicon with an ETFE front surface.

The phrase "architectural membrane" is known in the art and is intended to include structural elements, more specifically to "fabric structures" also referred to herein as "architectural membrane structures", "architectural structures" or simply as "structures" or "composites", the last two terms being used interchangeably. Examples include tents, awnings, canopies, shaded parking structures, stadiums, amphitheaters, airports and the like.

In some aspects the structure is a tensioned or tensile structure which typically carries tension stress only, without compression or bending. In specific examples, the structure disclosed herein meets a proposed Industry Standard for carrying tension or shear only in the plane of the membrane.

The phrase "fluoropolymer" is known in the art and is intended to include, for example, polytetrafluoroethylene, copolymers of tetrafluoroethylene and hexafluoropropylene, tetrafluoroethylene-perfluoro(alkyl vinyl ether) copolymers (e.g., tetrafluoroethylene-perfluoro(propyl vinyl ether), FEP (fluorinated ethylene propylene copolymers), polyvinyl fluoride, polyvinylidene fluoride, and copolymers of vinyl fluoride, chlorotrifluoroethylene, and/or vinylidene difluoride (i.e., VDF) with one or more ethylenically unsaturated monomers such as alkenes (e.g., ethylene, propylene, butylene, and 1-octene), chloroalkenes (e.g., vinyl chloride and tetrachloroethylene), chlorofluoroalkenes (e.g., chlorotrifluoroethylene), fluoroalkenes (e.g., trifluoroethylene, tetrafluoroethylene (i.e., TFE), 1-hydropentafluoropropene, 2-hydropentafluoropropene, hexafluoropropylene (i.e. HFP), and vinyl fluoride), perfluoroalkoxyalkyl vinyl ethers (e.g., $CF_3OCF_2CF_2CF_2OCF{=}CF_2$); perfluoroalkyl vinyl ethers (e.g., $CF_3OCF{=}CF_2$ and $CF_3C_2CF_2OCF{=}CF_2$), and combinations thereof.

The fluoropolymer can be melt-processable, for example, as in the case of polyvinylidene fluoride; copolymers of vinylidene fluoride; copolymers of tetrafluoroethylene, hexafluoropropylene, and vinylidene fluoride copolymers of tetrafluoroethylene and hexafluoropropylene; copolymers of ethylene and tetrafluoroethylene and other melt-processable fluoroplastics; or the fluoropolymer may not be melt-processable, for example, as in the case of polytetrafluoroethylene, copolymers of TFE and low levels of fluorinated vinyl ethers, and cured fluoroelastomers.

Useful fluoropolymers include copolymers of HFP, TFE, and VDF (i.e., THV). Examples of THV polymers include those marketed by Dyneon, LLC under the trade designations "DYNEON THV".

Other useful fluoropolymers also include copolymers of ethylene, TFE, and HFP. Such polymers are marketed, for example, under the trade designation "DYNEON FLUORO-THERMOPLASTIC HTE" by Dyneon, LLC.

Additional commercially available vinylidene fluoride-containing fluoropolymers include, for example, those fluoropolymers having the trade designations; "KYNAR" (e.g., "KYNAR 740") as marketed by Arkema, Philadelphia, Pa.; "HYLAR" (e.g., "HYLAR 700") and "SOLEF" as marketed by Solvay Solexis USA, West Deptford, N.J.; and "DYNEON PVDF Fluoroplastics" such as DYNEON FP 109/0001 as marketed by Dyneon, LLC. Copolymers of vinylidene difluoride and hexafluoropropylene are also useful. These include for example KYNARFLEX (e.g. KYNARFLEX 2800 or KYNARFLEX 2550) as marketed by Arkema.

Commercially available vinyl fluoride fluoropolymers include, for example, those homopolymers of vinyl fluoride marketed under the trade designation "TEDLAR" by E.I. du Pont de Nemours & Company, Wilmington, Del.

Useful fluoropolymers also include copolymers of tetrafluoroethylene and propylene (TFE/P). Such polymers are commercially available, for example, under the trade designations "AFLAS as marketed by AGC Chemicals America, or "VITON" as marketed by E.I. du Pont de Nemours & Company, Wilmington, Del.

Useful fluoropolymers also include copolymers of ethylene and TFE (i.e., "ETFE"). Such polymers may be obtained commercially, for example, as marketed under the trade designations "DYNEON FLUOROTHERMOPLASTIC ET 6210A", "DYNEON FLUOROTHERMOPLASTIC ET 6235", or by Dyneon, LLC, or under the trade designation "NEOFLON ETFE" from Daikin America Inc (e.g. NEOFLON ETFE EP521, EP541, EP543, EP610 OR EP620), or under the trade designation "TEFZEL" from E.I. du Pont de Nemours & Company, Wilmington, Del.

Additionally, useful fluoropolymers include copolymers of ethylene and chlorotrifluoroethylene (ECTFE). Commercial examples include Halar 350 and Halar 500 resin from Solvay Solexis Corp.

Other useful fluoropolymers include substantially homopolymers of chlorotrifluoroethylene (PCTFE) such as Aclar from Honeywell.

Modified fluoropolymers, a subgroup of fluoropolymers in general, are also useful. Suitable functional groups attached in modified (functionalized) fluoropolymers are carboxylic acid groups such as maleic or succinic anhydride (hydrolyzed to carboxylic acid groups), carbonates, epoxy, acrylate and its derivative such as methacrylate, phosphoric acid and sulfonic acid. Commercially available modified fluoropolymers include Fluon® LM-ETFE AH from Asahi, Neoflon® EFEP RP5000 and Neoflon® ETFE EP7000 from Daikin and Tefzel® HT2202 from DuPont.

Fluoropolymeric substrates may be provided in any form (e.g., film, tape, sheet, web, beads, particles, or as a molded or shaped article) as long as the fluoropolymer can be processed.

Fluoropolymers are generally selected as outer layers to provide chemical resistance, electrical insulation, weatherability and/or a barrier to moisture.

The term "encapsulated" is intended to mean that the reinforcement material is covered with a fluoropolymer. The coating does not necessarily need to be uniform in coverage or thickness but generally coats the fibers or the reinforcement. The encapsulating material can be dipped, sprayed, painted, vapor deposited, laminated etc. onto the reinforcement. Additionally, the encapsulant, e.g., the fluoropolymer, can be sintered at elevated temperatures.

For example, an encapsulated reinforcement construct can be formed by coating or impregnating a reinforcement substrate, e.g. fiberglass, with PTFE or the like in known manner, for example, by applying the PTFE from a suspension and fusing the applied PTFE, for example in accordance with the teachings of U.S. Pat. No. 3,928,703 to Cook.

Encapsulated reinforcement constructs are known in the art and can be prepared by the methods described in Non-melt Processible Fluoroplastics: The Definitive User's Guide and Databook, Sina Ebnesajjad, 2000, Plastics Design Library, Norwich, N.Y., the contents of which are incorporated herein by reference. See for example, page 175 through 178. Briefly, a fiberglass fabric is passed through a fluoropolymer dispersion. Excess material is removed from the fabric and the materials are dried. This process can be repeated multiple times and then the composite can be subjected to baking, calendering and/or sintering.

For example, a woven fiberglass fabric can be heat-cleaned to minimize residual sizing. A coating can be applied by dipping the substrate in an aqueous dispersion of PTFE (TE3879 obtained from Dupont and applied at 53% solids). The coating is then dried and sintered in a single or multi-zone coating tower with drying temperatures of 350° F. and sintering zone temperatures 680° F.

The construct can be finished with a bondable layer topcoat using, for example, an FEP dispersion (TE-9568 obtained from DuPont and applied at 38% solids). The topcoat can be applied by dipping, drying and sintering in a single or multi-zone tower. The drying temperature is about 350° F., and the sintering temperature is about 680° F.

If desired, one or a mixture of additives may be included in the encapsulating solution/dispersion for producing a desired effect. For example, a colorant or dye, UV stabilizer, or a mixture of fungicides, bactericides, mildewicides or other biocidal agents may be incorporated into the material so as to result in a film having enhanced resistant to environmental effects.

Suitable examples of encapsulated reinforcement constructs include architectural membranes. Encapsulated reinforcements include those prepared from fiberglass substrates encapsulated with PTFE which is subsequently sintered. Examples include SHEERFILL® products by Saint-Gobain Performance Plastics Corporation (Merrimack, N.H.), such as SHEERFILL® IIA, I-HT, II-HT, IVA or V, DURASKIN (Verseidag, Germany), SKYTOP (Chukoh, Japan) or SOLUS (Taconic, South Korea).

The term "reinforcement" is recognized in the art and is intended to include materials that are fabrics, wovens, non-wovens, lay downs, meshes and the like.

Suitable reinforcement materials include, for example, glass, fiberglass, aramids, polyesters, polyamides, carbon fibers, metal fibers, halopolymers and the like. Any suitable textile material capable of withstanding processing temperatures and able to sustain the static and dynamic mechanical loads in a structure may be employed as the reinforcing material in accordance with the present invention. Examples include, inter alia, fiberglass, ceramics, graphite (carbon), PBI (polybenzimidazol), polyaramides such as KEVLAR and NOMEX, polyesters such as REEMAY, polyamides, polyimides, thermoplastics such as TEFZEL (ETFE), polyethersulfones, polyetherimides, polyetherketones, novoloid phenolic fibers such as KYNOL, PTFE, cotton, and other natural and synthetic fibers. The reinforcing material may comprise a yarn filament, monofilament, slit film or the like assembled as a textile. The reinforcing material also may comprise a metallic material such as steel wire or mesh or the like. In one aspect, the reinforcing material comprises fiberglass In particular, materials that can withstand processing temperatures of at least 360° C. are desirable.

The term "contact" means that the photovoltaic device can be in direct contact with a material or indirect contact, such as where an encapsulant surrounds a portion or all of the photovoltaic. Contact should also be understood as encompassing the situations where the photovoltaic device can move and reposition as stresses to the fluoropolymer encapsulated reinforcement layer cause the layer to deform (e.g., wind, snow, rain). Therefore, the contact between the photovoltaic and surrounding layers is such that the construct is not so rigid as to cause the photovoltaic device to break due to exterior stresses to one of more of the surrounding layers. Additionally, the photovoltaic device can "move" with the architectural system as the system itself moves when exerted upon.

The phrase "bondable layer" is intended to encompass two types of materials. In one aspect, the bondable layer is a layer that has similar characteristics to the fluoropolymer material but is adapted to provide adhesive characteristics for the adhesion to another material, such as another fluoropolymer. Suitable bondable materials include, for example, PFA, PVDF, ETFE, THV or FEP.

In another aspect, the bondable layer, the fluoropolymer of the fluoropolymer encapsulated reinforcement or both can be surface treated. Generally, hydrophilic functionalities are attached to the fluoropolymer surface, rendering it easier to wet and provides opportunities for chemical bonding. There are several methods to functionalize a fluoropolymer surface including plasma etch, corona treatment, chemical vapor deposition, or any combination thereof. In another embodiment, plasma etching includes reactive plasmas such as hydrogen, oxygen, acetylene, methane, and mixtures thereof with nitrogen, argon, and helium. Corona treatment can be conducted in the presence of reactive hydrocarbon vapors such as ketones, e.g., acetone, C1-C4 carbon chain length alcohols, p-chlorostyrene, acrylonitrile, propylene diamine, anhydrous ammonia, styrene sulfonic acid, carbon tetrachloride, tetraethylene pentamine, cyclohexyl amine, tetra isopropyl titanate, decyl amine, tetrahydrofuran, diethylene triamine, tertiary butyl amine, ethylene diamine, toluene-2,4-diisocyanate, glycidyl methacrylate, triethylene tetramine, hexane, triethyl amine, methyl alcohol, vinyl acetate, methylisopropyl amine, vinyl butyl ether, methyl methacrylate, 2-vinyl pyrrolidone, methylvinylketone, xylene or mixtures thereof.

Some techniques use a combination of steps including one of these methods. For example, surface activation can be accomplished by plasma or corona in the presence of an excited gas species. For example c-treatment refers to a method for modifying the surface by corona treatment in the presence of a solvent gas such as acetone or a C1-C4 carbon chain length alcohol.

Not to be limited by theory, the method has been found to provide strong interlayer adhesion between a modified fluoropolymer and a non fluoropolymer interface (or a second modified fluoropolymer). In one way, a fluoropolymer and a non fluoropolymer shape are each formed separately. Subsequently, the fluoropolymer shape is surface treated by the treatment process described in U.S. Pat. Nos. 3,030,290; 3,255,099; 3,274,089; 3,274,090; 3,274,091; 3,275,540; 3,284,331; 3,291,712; 3,296,011; 3,391,314; 3,397,132; 3,485,734; 3,507,763; 3,676,181; 4,549,921; and 6,726,979, the teachings of which are incorporated herein in their entirety for all purposes. Then, the resultant modified fluoropolymer and non fluoropolymer shapes are contacted together for example by heat lamination to form a multilayer film. Additionally, the multilayer film can be submitted to a UV radiation with wavelengths in the UVA; UVB and/or UVC range.

In one aspect, the surface of the fluoropolymer substrate is treated with a corona discharge where the electrode area was flooded with acetone, a C1-C4 carbon chain length alcohol, tetrahydrofuran methyl ethyl ketone, ethyl acetate, isopropyl acetate or propyl acetate vapors.

Corona discharge is produced by capacitative exchange of a gaseous medium which is present between two spaced electrodes, at least one of which is insulated from the gaseous medium by a dielectric barrier. Corona discharge is somewhat limited in origin to alternating currents because of its capacitative nature. It is a high voltage, low current phenomenon with voltages being typically measured in kilovolts and currents being typically measured in milliamperes. Corona discharges may be maintained over wide ranges of pressure and frequency. Pressures of from 0.2 to 10 atmospheres generally define the limits of corona discharge operation and atmospheric pressures generally are desirable. Frequencies ranging from 20 Hz to 100 kHz can conveniently be used: in particular ranges are from 500 Hz, especially 3000 Hz to 10 kHz.

All details concerning the corona discharge treatment procedure are provided in a series of U.S. Patents assigned to E. I. du Pont de Nemours and Company, USA, described in expired U.S. Pat. No. 3,676,181, and Saint-Gobain Performance Plastics Corporation U.S. Pat. No. 6,726,979, the teachings of which are incorporated herein in their entirety for all purposes. An example of the proposed technique may be found in U.S. Pat. No. 3,676,181 (Kowalski).

In another aspect, the surface of the fluoropolymer is treated with a plasma. The phrase "plasma enhanced chemical vapor deposition" (PECVD) is known in the art and refers to a process that deposits thin films from a gas state (vapor) to a solid state on a substrate. There are some chemical reactions involved in the process, which occur after creation of a plasma of the reacting gases. The plasma is generally created by RF (AC) frequency or DC discharge between two electrodes wherein between the substrate is placed and the space is filled with the reacting gases. A plasma is any gas in which a significant percentage of the atoms or molecules are ionized, resulting in reactive ions, electrons, radicals and UV radiation.

The term "unencapsulated" is intended to mean a portion or surface of reinforcement that is not coated, treated, or otherwise in contact with a fluoropolymer, e.g., the surface is unmodified or virgin.

Therefore, in one aspect, the photovoltaic/architectural membrane construct can be "sided"; that is, one side of the reinforcement includes a fluoropolymer and the other side of the reinforcement does not include a fluoropolymer and is unencapsulated. This unmodified surface can then be further treated. Suitable examples of one "sided" reinforcements include microwave transmissive composite materials.

For example, the application of the fluoropolymer dispersion can be carefully controlled and localized at the surface of the reinforcement, with penetration being adequate to achieve the desired bond. One method to achieve this is by kiss roll coating in which a roll transfers coating to the fabric by touching or "licking" the surface to apply coating to only one side of the fabric. Another method is a combination of kiss coating followed by pour coating. The kiss coating limits coating application to one side and pour coating can then be used to build up additional coating thickness.

Penetration depths of the dispersion should be controlled so that no obvious liquid penetration, or "bleed through" occurs to the other side. There should be no visible resin on the uncoated side of the fabric. Penetration depth should not generally exceed 50% of the overall reinforcement thickness.

The elimination of bleed through of the fluoropolymer dispersion is dependent on a number of factors, including the density of the reinforcement, the viscosity of the dispersion, the specific gravity of the dispersion, the coating method and its corresponding parameters such as coating time, etc.

A fluoropolymer dispersion can be chosen based on the characteristics required to produce the desired product. The specific dispersion selected has sufficient penetration to create an adequate bond between the reinforcement and its associated component. Dispersions having a wide range of viscosities can be utilized dependent on the thickness and porosity of the reinforcement, the desired weight of the finished product, the stiffness of the finished product, etc.

The specific gravity of the fluoropolymer dispersion also affects the coating properties. The specific gravity of the dispersion should be in the range of between 1.05 and 1.5, more particularly at least 1.35. Coating weights should be about 0.5 oz/sq yd and less than about 50 oz/sq yd.

Fluoropolymers useful in the present invention can be selected from those known to those skilled in the art, as described for example in U.S. Pat. No. 4,770,927 (Effenberger et al.), the disclosure of which is herein incorporated by reference in its entirely.

Commercially available fluoropolymer products useful with the present invention include the following perfluoroplastics:
PTFE: such as Daikin Polyflon; Dupont Teflon; ICI Fluon; Ausimont Algoflon;
FEP: such as Daikin Neoflon; Dupont Teflon;
PFA: such as Daikin Neoflon; Dupont Teflon; Ausimont Hyflon;
MFA: such as Ausimont Hyflon;
Fluoroelastomers: such as Dupont Viton; 3M Fluorel; Ausimont Tecnoflon; Daikin Daiel; Asahi Glass Aflas; and/or
Perfluoroelastomers: such as Dupont Kalrez; DaikinPerfluor.

The fluoropolymers can also include fillers, pigments and other additives, examples of which include titanium dioxide, talc, graphite, carbon black, cadmium pigments, glass, metal powders and flakes, and other high temperature materials such as sand, fly ash, etc.

The reinforcement layers can be coated by the fluoropolymer by various techniques employing vertical coating towers, spray coaters, reverse roll coaters, roller coaters, horizontal coaters with doctor blades, kiss roll coating or other methods known in the art.

The construct can be finished with a bondable layer topcoat using, for example, an FEP dispersion (TE-9568 obtained from DuPont and applied at 38% solids).

The topcoat can be applied by dipping, drying and sintering in a single or multizone tower. The drying temperature is about 350° F., and the sintering temperature is about 680° F.

If desired, one or a mixture of additives may be included in the encapsulating solution/dispersion for producing a desired effect. For example, a colorant or dye, UV stabilizer, or a mixture of fungicides, bactericides, mildewicides or other biocidal agents may be incorporated into the material so as to result in a film having enhanced resistant to environmental effects.

Examples of the "sided" layers include those manufactured by Saint-Gobain Performance Plastics Corporation (Merrimack, N.H.) such as RAYDEL® materials, e.g., M15-OS and M26-OS which are fiberglass single side coated with PTFE.

The phrase "hook and loop" engageable fastener system is intended to include those materials that are also referred to as "flexible touch fastener", "fastener with securing loops", "loop engageable fastener", "intermeshing closure", "burr fasteners" and are flexible intermeshing closures that adhere to each other when brought into contact. Such fastener systems are commercially available from VELCRO® (Velcro, Manchester N.H.), Minnesota Manufacturing & Mining Co. (3M SCOTCHMATE™), and DURAGRIP™. The general construction of the fastener system is comprised of a soft fuzzy material (Loop) side and a rougher (Hook) side. When pushed together, hundreds of tiny hooks engage the loops to form a strong fastener. Alternatively, there are systems that have a male/female design where the male "lollipop" fits securely into a corresponding female site where the lollipop is engaged by the female portion.

In one embodiment, the material is VELCRO® hook material model 752 and VELCRO® loop material model 3001.

Another embodiment employs a "flexible" substrate in place of the hook and loop assembly. Flexible substrate could be any material that moves in the x, y and z planes. The material can stretch and flex with the movement of the assembly due to environmental effects such as heat, cold and wind. Suitable materials include, for example, foams, such as closed cell foams.

Examples of foams include, but are not limited to, polyurethane foams, acrylic foams, PVC foams, polyethylene foams, neoprene foams, EPDM foams, styrenic foams, ABS foams, SANTOPRENE foams, NORPRENE foams and rubber foams (both natural and synthetic).

Adhesives that can be used with foams, as in bonding layers, in addition to those listed below, include acrylic adhesives, silicone adhesives, epoxy adhesives and elastomeric adhesives, especially penetrating elastomeric sealants. Suitable penetrating elastomeric sealants include those described in U.S. Patent Publication Nos. 2008/0221232 and 2009/0162664, the contents of which are incorporated herein by reference.

In still another embodiment, the flexible substrate can be a flexible elastomeric sealant layer. This can include materials capable of stretching and flexing with the PV. The elastomeric sealant layer may be incorporated as a separate layer and bonded to other layers by adhesives. Suitable adhesives include those listed previously. Penetrating elastomeric sealants, and penetrating elastomeric curing sealants are particularly preferred.

The term "adhesive" is known in the art and includes various materials that can adhere two surfaces to each other. Suitable adhesives include, for example, neoprene rubber, butyl rubber (e.g., Heliobond PVA 600BT), a two part epoxy, silicone caulks or a polyurethane adhesive.

It should be understood that each "layer" can be a strip, a circular attachment, a square attachment, oblong etc. etc. The layer does not need to be continuous or unitary in nature but sufficient to provide enough contact surface to the adjacent layer to accomplish the purpose of the layer.

Film thicknesses are set forth herein in terms of "mils", wherein one mil is equal to 0.001 inch.

In one aspect the layers are heat bonded to each other.

Combinations of various bonding/adhesion methods described herein are contemplated and included as part of the present invention.

Referring now to a first embodiment depicted in FIG. 1, the photovoltaic device/architectural system 10 includes a first layer that is a fluoropolymer encapsulated reinforcement layer 20 (architectural membrane). Fluoropolymer encapsulated reinforcement layer 20 has first and second sides that are equivalent. The second layer, bondable layer 30, is disposed on the second side of the first layer. Third layer 40, is a fluoropolymer encapsulated reinforcement material that has a first side that provides an unencapsulated reinforcement surface 45 and a fluoropolymer surface 43 (a "sided" material). Encapsulated reinforcement surface 43 is adhered to bondable layer 30.

Fourth layer, adhesive 50, is disposed on unencapsulated reinforcement surface 45 and adheres surface 45 to shaped edging 60.

Shaped edging 60 is configured and positioned about photovoltaic device 80.

Photovoltaic device can be square, rectangular, circular, octagonal, etc. and helps dictate the positioning of shaped edging 60 and all above-noted layers with respect to the ultimate construct. Shaped edging 60 has a profiled portion 70, e.g., a slot or a groove, that accommodates a side portion of photovoltaic device 60, such that photovoltaic device is slidably engaged and secured by shaped edging 60. Shaped edging 60 can be located about the perimeter of photovoltaic device 80 and is not required to be unitary in nature; it can take the form of a frame, tabs, segments, etc. The only requirement is that a sufficient amount of shaped edging 60 is used to support and secure photovoltaic device 80 in system 10.

Shaped edging 60 can be composed of EPDM (ethylene propylene diene monomer), SBR (styrene-butadiene rubber), a fluorosilicone, a silicone, a Viton (synthetic rubber and fluoropolymer elastomer), a neoprene (polychloroprene), a polyurethane, hypalon (chlorosulfonated polyethylene (CSPE) synthetic rubber (CSM)), or a natural rubber. The slotted or grooved portion of shaped edging 60 penetrates a sufficient distance to engageably secure photovoltaic device 80 to system 10. Generally profile portion 70 e.g., a slot or groove is minimally smaller than the thickness of photovoltaic device 80 so as to grip photovoltaic device 80 without damage. Alternatively, profile portion 70 can have dimensions larger than the thickness of photovoltaic device 80; this generally would require then that at least 2 portions of shaped edging 60 engage photovoltaic device 80 to securely attach to system 10.

As noted, profile portion 70 can be a slot, a groove, a snap fit assembly, or other suitable engageable surface that secures photovoltaic device 80 within shaped edging 60. Additionally, the interior portion(s) of profile portion 70 can further include additional surface(s)/protrusion(s) that help to grip and secure photovoltaic device 80 within profile portion 70 of shaped edging 60. Such protrusions can have adhesion characteristics much like a pressure sensitive adhesive, such that photovoltaic device 80 is secured within profile portion 70. The protrusions can take on various shapes and dimensions, such as nubs, suction cup like appendages, etc. Generally the protrusions are dimensioned such that photovoltaic device is securely attached within profile portion 70 but can still allow removal with under desired circumstances.

In alternative embodiments, photovoltaic device 80 can be secured by an edging that provides a hinge, a snap-fit, a clamp or other similar attachment systems that can secure photovoltaic device to system 10. In any of these alternate edge holding devices, the material can be polymeric or a metallic alloy as long as extensibility of the attachment system is maintained.

Optionally, "flap" 90 can be adhered to encapsulated reinforcement construct 20 and can include an adhesive or flexible bonding layer. Flap 90 helps protect photovoltaic device 80 from water, snow, ice, hail, etc. The flap provides a low profile, allowing snow and ice to easily pass over the PV edge without damage to the device. Flap 90 can also be a heat bondable material such that flap 90 and layer 20 can be heat bonded to each other.

It should be understood that, in general, slot portion should grip the photovoltaic device 80 in a manner such that photovoltaic device is held securely in place. Profile portion 70 can be large enough to accommodate foam or cushioning material that provides some protection about the engaged edge of photovoltaic device 80 in profile portion 70. Alternatively, a silicone caulk or adhesive could be applied to profile portion 70 to help secure photovoltaic device.

Figure 2:
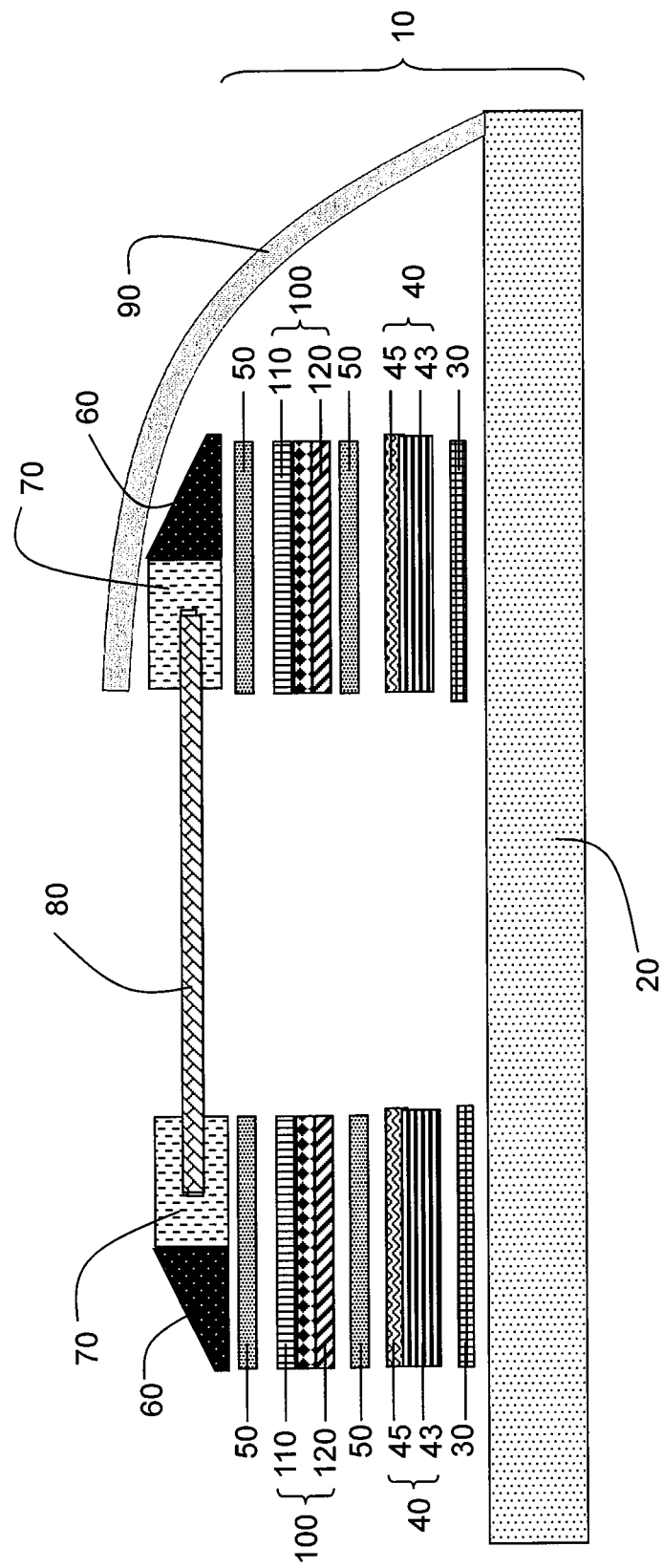
FIG. 2 provides a specific embodiment of the invention.

FIG. 2 provides another embodiment of the invention with additional fifth and sixth layers included. Fifth layer, hook and loop assembly 100, comprising hook 110 and loop 120, is disposed upon fourth layer adhesive 50. Sixth layer, adhesive 50, is disposed upon the upper surface of hook and loop assembly 100 and adheres to shaped edging 60.

FIG. 3 provides still another embodiment of the invention with additional fifth and sixth layers included. Fifth layer, flexible substrate 130 is disposed upon fourth layer adhesive 50 and sixth layer adhesive 50 is disposed on the upper surface of flexible substrate 130 to adhere to shaped edging 60.

All layers of the system can be fully assembled prior to on site installation of the architectural membrane. This is generally possible if the expected elongation of the membrane during its positioning or installation will be less than about 3%.

More commonly architectural membranes experience significantly greater than 3% elongation during installation.

Therefore, one embodiment of the invention is to have parts preassembled before on site work. Referring now to FIGS. 1 through 3, components 20/30/40, 20/30/40/50/120 or 20/30/40/130, for example but not limited to, can be assembled in a factory. Additionally, parts 70 and 80 can be preassembled, although most conveniently separately from combinations noted above. At the site, photovoltaic 80 can be positioned within profile portion, e.g. slots 70 and adhered to fluoropolymer encapsulated reinforcement layer 20 via bondable layer 30 and one-sided layer 40 on site by heat welding. This way, system 10 can be appropriately sized and placed to adjust for dimensional changes that may occur during installation while still providing for final anchoring of the photovoltaic device.

Alternatively, the system 10 as depicted in FIGS. 1 through 3 can be installed on site.

One additional advantage of the various embodiments presented herein, is that if for any reason the system is no longer desired, the various layers and photovoltaic device 20 can be removed, thus leaving only the architectural membrane 15.

It should be understood that release layers can be used to protect, for example, the bonding or adhesive layers of the architectural systems described herein so that assembly can be effected on site or assembled prior to installation on site, in full or in part.

The following paragraphs enumerated consecutively from one (1) through twelve (12) provide for various aspects of the present invention. In one embodiment, in a first paragraph (1), the present invention provides a photovoltaic device/architectural membrane system comprising:

1. A photovoltaic device/architectural membrane system comprising:
   a first layer comprising a fluoropolymer encapsulated reinforcement layer having a first side and a second side;
   a second layer comprising a bondable layer disposed on the second side of the first layer;
   a third layer, comprising a fluoropolymer encapsulated reinforcement such that a first side provides an unencapsulated reinforcement surface, such that the encapsulated surface is adhered to the bondable layer there between;

a fourth layer, comprising an adhesive disposed upon the unencapsulated reinforcement surface of the third layer; and a shaped edge disposed upon the fourth layer, wherein the shaped edge comprises an outer edge and an inner edge, wherein a profile is located about the inner edge and is adapted to engage and support a photovoltaic device.

2. The photovoltaic device/architectural membrane system of paragraph 1, wherein the profile is a slot, a groove, or a snap fit engagement system.

3. The photovoltaic device/architectural membrane system of either paragraphs 1 or 2, further comprising a fifth layer and sixth layer, wherein the fifth layer comprises a hook and loop system or flexible substrate disposed on the fourth layer, the sixth layer is an adhesive layer and the shaped edge is disposed on the sixth layer.

4. The photovoltaic device/architectural membrane system of any of paragraphs 1 through 3, wherein the fluoropolymer of the first layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

5. The photovoltaic device/architectural membrane system of any of paragraphs 1 through 4, wherein the reinforcement of the first layer comprises a glass, polyaramid, polyester, carbon fiber or metal fiber fabric, mesh, or nonwoven material.

6. The photovoltaic device/architectural membrane system of any of paragraphs 1 through 5, wherein the bondable layer is a PFA, PVDF, THV, ETFE or an FEP.

7. The photovoltaic device/architectural membrane system of any of paragraphs 1 through 6, wherein the fluoropolymer of the third layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

8. The photovoltaic device/architectural membrane system of any of paragraphs 1 through 7, wherein the reinforcement of the third layer comprises a glass, polyaramid, polyester, carbon fiber or metal fiber fabric, mesh, or nonwoven material.

9. The photovoltaic device/architectural membrane system of any of paragraphs 1 through 8, wherein the fourth layer adhesive is a neoprene rubber, a two part epoxy, a silicone caulk or a polyurethane.

10. The photovoltaic device/architectural membrane system of any of paragraphs 3 through 9, wherein the sixth layer adhesive is a neoprene rubber, a two part epoxy, a silicone caulk or a polyurethane.

11. The photovoltaic device/architectural membrane system of any of paragraphs 1 through 10, wherein the bondable layer is surface treated.

12. The photovoltaic device/architectural membrane system of any of paragraphs 1 through 11, further comprising a segment of material adhered to the fluoropolymer encapsulated reinforcement in such a configuration so as to cover an upward facing portion of the system such that water, snow, ice, dirt or debris are distributed away from the photovoltaic device.

The invention will be further described with reference to the following non-limiting Examples. It will be apparent to those skilled in the art that many changes can be made in the embodiments described without departing from the scope of the present invention. Thus the scope of the present invention should not be limited to the embodiments described in this application, but only by embodiments described by the language of the claims and the equivalents of those embodiments. Unless otherwise indicated, all percentages are by weight.

EXAMPLES

Example 1

FIG. 1 is exemplary for this example. EPDM shaped edging 60 (custom design obtained from AAA Acme Rubber Company) was designed to hold photovoltaic module 80 and have a sloped outer edge to move sliding snow/ice up over the photovoltaic device 80 in harsh conditions.

Shaped edging 60 was assembled to form a frame. The initial mockup sample was made with partial edges but it can also be made with angled frame corners to make a complete frame. Shaped edging 60 was pressed into butyl adhesive 50 (e.g., Heliobond PVA 600BT) (with a release sheet on the back of adhesive 50).

One-sided PTFE coated fabric 40 was heat sealed to the installed SHEERFILL 20 to provide three sides of the frame (two long sides and one short side). Heat sealing was accomplished using 5 mil FEP film 30 and a 3"×5" tacker set at 680° F. using 2.5 minutes dwell times.

Shaped edging pieces 60 were pressed so that the butyl adhesive 50 engaged the one-sided fabric 40. This pressing was enhanced by rolling extrusion with a 10 pound roller or weighting with flat weights.

Photovoltaic 80 was slideably engaged into profile portions 70 in shaped edging 60 (like sliding an oven rack into an oven). This completed three sides of the frame. The fourth side of the frame was attached by sliding the shaped edging 60 onto photovoltaic 80 (lining up photovoltaic 80 with profile portion 70). Shaped edging 60 for one short side of frame was attached to one-sided PTFE coated fabric 40. 40 was wider than shaped edging 60 to allow it to be heat sealed in place (at the end of the installation procedure) to the installed SHEERFILL 20 using 5 mil bondable layer 30, e.g., FEP film.

Example 2

In an exemplary embodiment, a one-sided material 40 is heat sealed to the installed reinforcement layer 20 (SHEERFILL) using a 5 mil FEP bonding film 30. Heat sealing is accomplished using 3 minutes at 680F with a 3" wide heat sealer. Silicone PSA (Dow Corning 7735 or similar) can be applied to one-sided layer (OS fabric) 40 before (if supplied with appropriate release film) or after heat sealing.

Trim edge material 60 is made of 70 durometer extrusion grade silicone (Ultra 70 or similar) and has silicone PSA (Dow Corning 7735 or similar) on lower face. Adhesive 50 can be applied directly to the part as it is extruded or as a transfer adhesive.

Trim edge 60 is fit along the perimeter of the flexible PV module 80 (Fuji or Unisolar or similar). Optional release sheets are removed from the silicone adhesives on the trim edge 60 and the OS fabric layer 40 and the two adhesive surfaces are mated (starting at one end and moving towards the other) and pressed in place.

A corner trim piece can be applied to complete/neaten the frame.

Although the present invention has been described with reference to preferred embodiments, persons skilled in the art will recognize that changes may be made in form and detail without departing from the spirit and scope of the invention.

All references cited throughout the specification, including those in the background, are incorporated herein in their entirety. Those skilled in the art will recognize, or be able to ascertain, using no more than routine experimentation, many equivalents to specific embodiments of the invention described specifically herein. Such equivalents are intended to be encompassed in the scope of the following claims.

What is claimed is:

1. A photovoltaic device/architectural membrane system comprising:
a first layer comprising a fluoropolymer encapsulated reinforcement layer having a first side and a second side;
a second layer comprising a bondable layer disposed on the second side of the first layer;
a third layer, comprising a fluoropolymer encapsulated reinforcement such that a first side provides an unencapsulated reinforcement surface, such that the encapsulated surface is adhered to the bondable layer there between;
a fourth layer, comprising an adhesive disposed upon the unencapsulated reinforcement surface of the third layer;
a shaped edge disposed upon the fourth layer, wherein the shaped edge comprises an outer edge and an inner edge, wherein a profile is located about the inner edge and is adapted to engage and support a photovoltaic device; and
wherein the outer shaped edge is a sloped outer edge.

2. The photovoltaic device/architectural membrane system of claim 1, wherein the profile is a slot, a groove, or a snap fit engagement system.

3. The photovoltaic device/architectural membrane system of claim 1, further comprising a fifth layer and sixth layer, wherein the fifth layer comprises a hook and loop system or flexible substrate disposed on the fourth layer, the sixth layer is an adhesive layer and the shaped edge is disposed on the sixth layer.

4. The photovoltaic device/architectural membrane system of claim 1, wherein the fluoropolymer of the first layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

5. The photovoltaic device/architectural membrane system of claim 1, wherein the reinforcement of the first layer comprises a glass, fiberglass, polyaramid, polyester, carbon fiber or metal fiber fabric, mesh, or nonwoven material.

6. The photovoltaic device/architectural membrane system of claim 1, wherein the bondable layer is a PFA, PVDF, THV, ETFE or an FEP.

7. The photovoltaic device/architectural membrane system of claim 1, wherein the fluoropolymer of the third layer is polytetrafluoroethylene (PTFE), fluorinated ethylene propylene copolymers (FEP), copolymers of tetrafluoroethylene, hexafluoropropylene, and vinylidene difluoride (THV) or a perfluoroalkoxy resin (PFA).

8. The photovoltaic device/architectural membrane system of claim 1, wherein the reinforcement of the third layer comprises a glass, fiberglass, polyaramid, polyester, carbon fiber or metal fiber fabric, mesh, or nonwoven material.

9. The photovoltaic device/architectural membrane system of claim 1, wherein the fourth layer adhesive is a neoprene rubber, a two part epoxy, a silicone caulk or a polyurethane.

10. The photovoltaic device/architectural membrane system of claim 3, wherein the sixth layer adhesive is a neoprene rubber, a two part epoxy, a silicone caulk or a polyurethane.

11. The photovoltaic device/architectural membrane system of claim 1, wherein the bondable layer is surface treated.

12. The photovoltaic device/architectural membrane system of claim 1, further comprising a segment of material adhered to the fluoropolymer encapsulated reinforcement in such a configuration so as to cover an upward facing portion of the system such that water, snow, ice, dirt or debris are distributed away from the photovoltaic device.

* * * * *